(12) United States Patent
Fujii et al.

(10) Patent No.: US 9,666,413 B2
(45) Date of Patent: May 30, 2017

(54) ION IMPLANTATION APPARATUS AND CONTROL METHOD FOR ION IMPLANTATION APPARATUS

(71) Applicant: Sumitomo Heavy Industries Ion Technology Co., Ltd., Tokyo (JP)

(72) Inventors: Yoshito Fujii, Ehime (JP); Tetsuya Kudo, Ehime (JP); Shinji Ebisu, Ehime (JP); Suguru Hirokawa, Ehime (JP); Keiji Okada, Kanagawa (JP)

(73) Assignee: SUMITOMO HEAVY INDUSTRIES ION TECHNOLOGY CO., LTD., Tokyo (JP)

( * ) Notice: Subject to any disclaimer, the term of this patent is extended or adjusted under 35 U.S.C. 154(b) by 0 days.

(21) Appl. No.: 14/740,928

(22) Filed: Jun. 16, 2015

(65) Prior Publication Data

US 2015/0364299 A1    Dec. 17, 2015

(30) Foreign Application Priority Data

Jun. 17, 2014  (JP) ................................. 2014-124227

(51) Int. Cl.
*H01J 37/20* (2006.01)
*H01J 37/317* (2006.01)

(52) U.S. Cl.
CPC .......... *H01J 37/3171* (2013.01); *H01J 37/20* (2013.01); *H01J 2237/202* (2013.01); *H01J 2237/31701* (2013.01)

(58) Field of Classification Search
CPC .......... H01J 37/16; H01J 37/18; H01J 37/185; H01J 37/20; H01J 37/3171
See application file for complete search history.

(56) References Cited

U.S. PATENT DOCUMENTS 6,092,485 A  *  7/2000  Ando ................ H01L 21/67213
                                                        118/723 FI
6,530,732 B1 *  3/2003  Theriault ............ H01L 21/6719
                                                        118/719

(Continued)

FOREIGN PATENT DOCUMENTS

JP     H10-189685 A    7/1998
JP     2000-012647 A   1/2000

(Continued)

*Primary Examiner* — David E Smith
(74) *Attorney, Agent, or Firm* — Michael Best & Friedrich LLP

(57) ABSTRACT

Provided is an ion implantation apparatus including: a vacuum processing chamber in which an ion implantation process for a wafer is performed; one or more load lock chambers that are used for bringing the wafer into the vacuum processing chamber and taking out the wafer from the vacuum processing chamber; an intermediate conveyance chamber that is disposed to be adjacent to both the vacuum processing chamber and the load lock chamber; a load lock chamber-intermediate conveyance chamber communication mechanism including a gate valve capable of sealing a load lock chamber-intermediate conveyance chamber communication port; and an intermediate conveyance chamber-vacuum processing chamber communication mechanism including a movable shielding plate capable of shielding a part or the whole of the intermediate conveyance chamber-vacuum processing chamber communication port.

18 Claims, 12 Drawing Sheets

(56) References Cited

U.S. PATENT DOCUMENTS

| | | | |
|---|---|---|---|
| 6,781,139 B2 * | 8/2004 | Evans | H01J 37/185 250/441.11 |
| 8,096,744 B2 | 1/2012 | Okada et al. | |
| 2001/0023522 A1 * | 9/2001 | Watson | H01L 21/6719 29/25.01 |
| 2002/0052094 A1 * | 5/2002 | Ryan | H01L 21/67742 438/464 |
| 2005/0205809 A1 * | 9/2005 | Uchida | B82Y 10/00 250/492.22 |
| 2006/0182532 A1 * | 8/2006 | Okada | H01L 21/67201 414/217 |
| 2007/0181830 A1 * | 8/2007 | Horsky | H01J 27/20 250/492.21 |
| 2008/0073564 A1 * | 3/2008 | Mun | H01J 37/20 250/441.11 |
| 2008/0138178 A1 | 6/2008 | Ferrara et al. | |
| 2009/0173894 A1 * | 7/2009 | Alcott | H01J 37/04 250/492.21 |
| 2010/0019147 A1 * | 1/2010 | Hatakeyama | G03F 1/86 250/307 |
| 2010/0247274 A1 | 9/2010 | Iizuka | |
| 2011/0121207 A1 * | 5/2011 | Brailove | H01L 21/67201 250/492.21 |
| 2013/0200271 A1 * | 8/2013 | Ishii | H01J 37/16 250/441.11 |
| 2015/0060694 A1 * | 3/2015 | Gunji | H01J 37/185 250/440.11 |

FOREIGN PATENT DOCUMENTS

| | | |
|---|---|---|
| JP | 2006-500752 A | 1/2006 |
| JP | 2010-225895 A | 10/2010 |
| JP | 4907077 B2 | 3/2012 |
| JP | 5323718 B2 | 10/2013 |
| WO | WO-2004/030017 A1 | 4/2004 |
| WO | WO-2008/070003 A2 | 6/2008 |

* cited by examiner

ION IMPLANTATION APPARATUS AND CONTROL METHOD FOR ION IMPLANTATION APPARATUS

RELATED APPLICATION

Priority is claimed to Japanese Patent Application No. 2014-124227, filed on Jun. 17, 2014, the entire content of which is incorporated herein by reference.

BACKGROUND OF THE INVENTION

1. Field of the Invention

The present invention relates to an ion implantation apparatus and a control method for an ion implantation apparatus.

2. Description of the Related Art

In a semiconductor production process, a process of implanting ions into a semiconductor wafer (hereinafter, it may be referred to as an "ion implantation process") is generally performed for the purpose of changing the conductivity and/or the crystalline structure of the semiconductor and the like. An apparatus that is used in the ion implantation process is called an ion implantation apparatus and has a function of forming an ion beam by generating ions using an ion source and accelerating the generated ions and a function of transporting the ion beam to a vacuum processing chamber and irradiating a wafer with the ion beam inside the vacuum processing chamber. In addition, in the ion implantation apparatus, a device that supplies a wafer before the implantation of ions to the vacuum processing chamber and takes out the wafer to which the ions have been implanted (hereinafter, it may be referred to as a "wafer conveyance device") is disposed.

The wafer conveyance device includes a load lock chamber used for bringing a wafer placed under the atmospheric pressure into the vacuum processing chamber. After bringing a wafer into the load lock chamber under the atmospheric pressure, the wafer conveyance device evacuates the load lock chamber, causes the load lock chamber that is in the vacuum state and the vacuum processing chamber to communicate with each other, and brings the wafer into the vacuum processing chamber. Since a time required for bringing the wafer into is highly influenced by an evacuation time of the load lock chamber, the processing capability of wafer conveyance can be increased by arranging a plurality of load lock chambers. For example, as a wafer conveyance device of which the conveyance capability is increased, a configuration may be employed in which two load lock chambers are arranged and an intermediate conveyance chamber is arranged between the load lock chambers and the vacuum processing chamber. In the intermediate conveyance chamber, a conveyance mechanism used for performing wafer conveyance between the vacuum processing chamber and the load lock chambers is disposed.

Since the intermediate conveyance chamber is arranged to be adjacent to the vacuum processing chamber, there are cases where the intermediate conveyance chamber is contaminated due to inflows of ions included in an ion beam transported to the vacuum processing chamber, particles sputtered by the ion beam, and the like. When the intermediate conveyance chamber and/or the conveyance mechanism disposed in the intermediate conveyance chamber is contaminated, there is a concern that a wafer that is in the middle of the conveyance process is influenced by the contamination.

SUMMARY OF THE INVENTION

The present invention is made in consideration of such situations, and an object thereof is to provide a technology capable of reducing the influence of contamination on the wafer that is in the middle of the conveyance process.

According to an aspect of the present invention, there is provided an ion implantation apparatus including: a vacuum processing chamber in which an ion implantation process for a wafer is performed; one or more load lock chambers that are used for bringing the wafer into the vacuum processing chamber and taking out the wafer from the vacuum processing chamber; an intermediate conveyance chamber that is disposed to be adjacent to both the vacuum processing chamber and the load lock chamber; an intermediate conveyance mechanism that is disposed in the intermediate conveyance chamber and performs wafer conveyance between the load lock chamber and the intermediate conveyance chamber and wafer conveyance between the intermediate conveyance chamber and the vacuum processing chamber; a load lock chamber-intermediate conveyance chamber communication mechanism that includes a load lock chamber-intermediate conveyance chamber communication port for communication between the load lock chamber and the intermediate conveyance chamber and a gate valve capable of sealing the load lock chamber-intermediate conveyance chamber communication port; and an intermediate conveyance chamber-vacuum processing chamber communication mechanism that includes an intermediate conveyance chamber-vacuum processing chamber communication port for communication between the intermediate conveyance chamber and the vacuum processing chamber and a movable shielding plate capable of shielding a part or the whole of the intermediate conveyance chamber-vacuum processing chamber communication port.

According to another aspect of the present invention, there is provided a control method for an ion implantation apparatus. This method is a control method for an ion implantation apparatus, and the ion implantation apparatus includes: a vacuum processing chamber in which an ion implantation process for a wafer is performed; one or more load lock chambers that are used for bringing the wafer into the vacuum processing chamber and taking out the wafer from the vacuum processing chamber; an intermediate conveyance chamber that is disposed to be adjacent to both the vacuum processing chamber and the load lock chamber; an intermediate conveyance mechanism that is disposed in the intermediate conveyance chamber and performs wafer conveyance between the load lock chamber and the intermediate conveyance chamber and wafer conveyance between the intermediate conveyance chamber and the vacuum processing chamber; a load lock chamber-intermediate conveyance chamber communication mechanism that includes a load lock chamber-intermediate conveyance chamber communication port for communication between the load lock chamber and the intermediate conveyance chamber and a gate valve capable of spieling the load lock chamber-intermediate conveyance chamber communication port; and an intermediate conveyance chamber-vacuum processing chamber communication mechanism that includes an intermediate conveyance chamber-vacuum processing chamber communication port for communication between the intermediate conveyance chamber and the vacuum processing chamber and a movable shielding plate capable of shielding a part or the whole of the intermediate conveyance chamber-vacuum processing chamber communication port. This method includes: setting the shielding plate to an open position not blocking wafer conveyance between the intermediate conveyance chamber and the vacuum processing chamber when the wafer is conveyed between the intermediate conveyance chamber and the vacuum processing chamber; and setting the shielding plate to a closed position shielding at least apart of the intermediate conveyance chamber-vacuum processing chamber communication port when an ion implantation process is performed in the vacuum processing chamber.

Optional combinations of the aforementioned constituting elements, and implementations of the invention in the form of methods, apparatuses, and systems, may also be practiced as additional modes of the present invention.

DETAILED DESCRIPTION OF THE INVENTION

Figure 1:
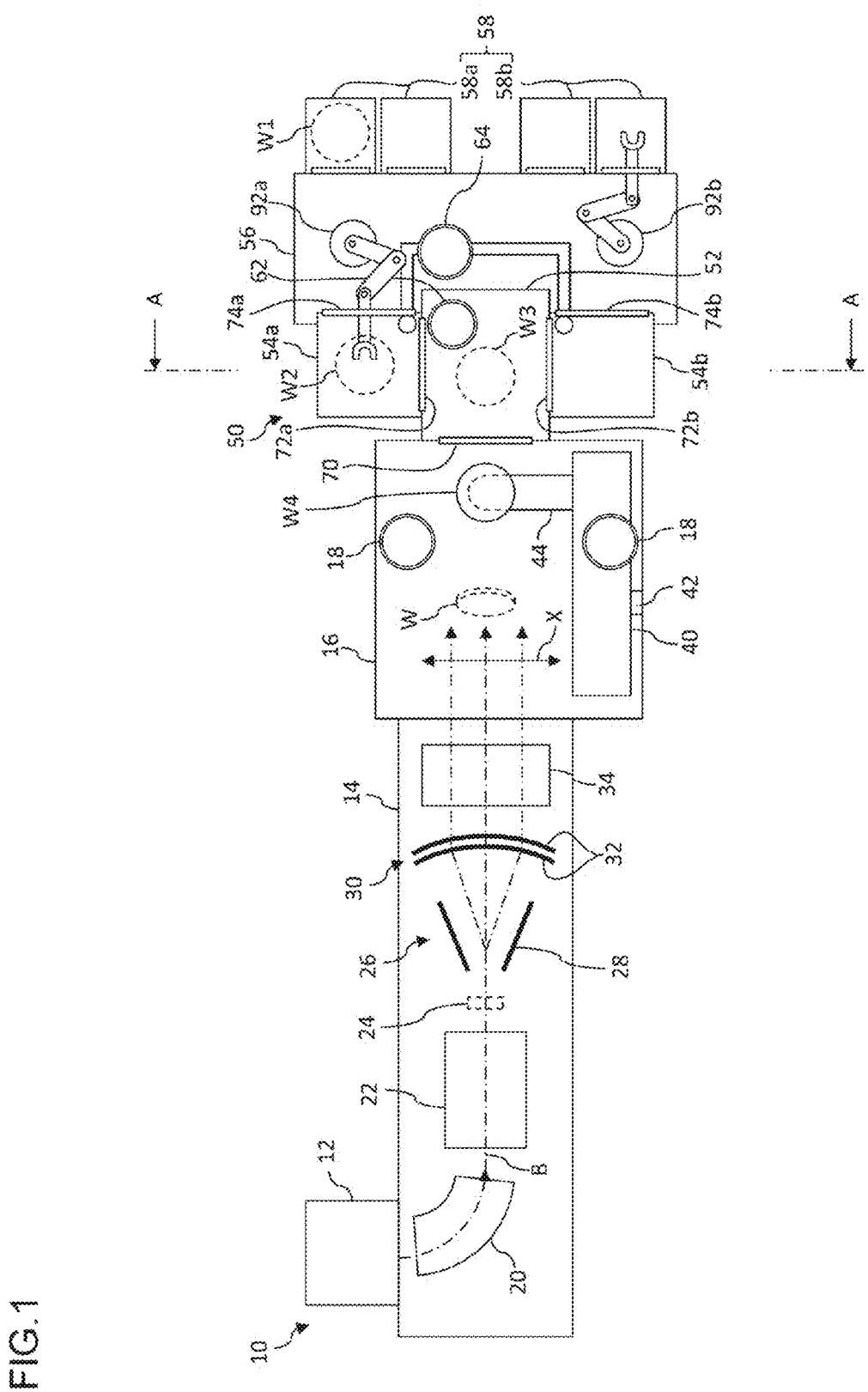
FIG. 1 is a top view that illustrates a schematic configuration of an ion implantation apparatus according to an embodiment.

The invention will now be described by reference to the preferred embodiments. This does not intend to limit the scope of the present invention, but to exemplify the invention.

Hereinafter, embodiments of the present invention will be described in detail with reference to the drawings. In description of the drawings, the same reference numeral is assigned to the same element, and duplicate description thereof will not be presented as is appropriate. The configuration described below is merely an example but does not limit the scope of the present invention.

Before describing the embodiments, an overview of the present invention will be described. An ion implantation apparatus according to this embodiment includes: a vacuum processing chamber in which an ion implantation process for a wafer is performed; a load lock chamber that is used for bringing the wafer into the vacuum processing chamber; and an intermediate conveyance chamber that is disposed to be adjacent to both the vacuum processing chamber and the load lock chamber and includes an intermediate conveyance mechanism conveying the wafer between the load lock chamber and the vacuum processing chamber. A load lock chamber-intermediate conveyance chamber communication mechanism used for conveying a wafer is disposed between the load lock chamber and the intermediate conveyance chamber, and an intermediate conveyance chamber-vacuum processing chamber communication mechanism used for conveying a wafer is disposed between the intermediate conveyance chamber and the vacuum processing chamber. In the load lock chamber-intermediate conveyance chamber communication mechanism, a gate valve is disposed, and the intermediate conveyance chamber and the vacuum processing chamber are maintained to be in a vacuum state during the operation of the ion implantation apparatus.

The wafer into which ions are to be implanted is brought into the vacuum processing chamber through the load lock chamber, the load lock chamber-intermediate conveyance chamber communication mechanism, the intermediate conveyance chamber, and the intermediate conveyance chamber-vacuum processing chamber communication mechanism. An ion beam, which is transported to the vacuum processing chamber, is irradiated on the wafer brought into the vacuum processing chamber, whereby an ion implantation process is performed. Since the intermediate conveyance chamber is arranged to be adjacent to the vacuum processing chamber, ions included in the ion beam transported to the vacuum processing chamber, particles sputtered by the ion beam, and the like may flow into the intermediate conveyance chamber and contaminate the chamber. In a case where the intermediate conveyance chamber and/or the intermediate conveyance mechanism is contaminated, the wafer in the middle of conveyance process may be influenced by the contamination. When the wafer is contaminated in the ion implantation process, a subsequent wafer process is influenced, whereby the device yield may be decreased. When the intermediate conveyance chamber and/or the intermediate conveyance mechanism need to be cleaned for reducing the influence of the contamination, the frequency of maintenance increases, which may lead to a decrease in the productivity of the ion implantation process.

Thus, in this embodiment, a shielding plate is disposed in the intermediate conveyance chamber-vacuum processing chamber communication mechanism so as to prevent contamination materials such as ions and particles from flowing into the intermediate conveyance chamber from the vacuum processing chamber. This shielding plate is configured to be able to shield at least a part of the intermediate conveyance chamber-vacuum processing chamber communication port for communication between the intermediate conveyance chamber and the vacuum processing chamber and has a movable structure for opening at the time of conveying a wafer and closing at the time of implanting ions. By arranging a shielding plate like this, it is difficult for contamination materials generated in the vacuum processing chamber to flow into the intermediate conveyance chamber through the intermediate conveyance chamber-vacuum processing chamber communication port. Accordingly, compared to a case where the shielding plate is not arranged, the contamination of the intermediate conveyance chamber and/or the conveyance mechanism is reduced, and the influence of contaminating the wafer that is in the middle of the conveyance is reduced.

Figure 2:
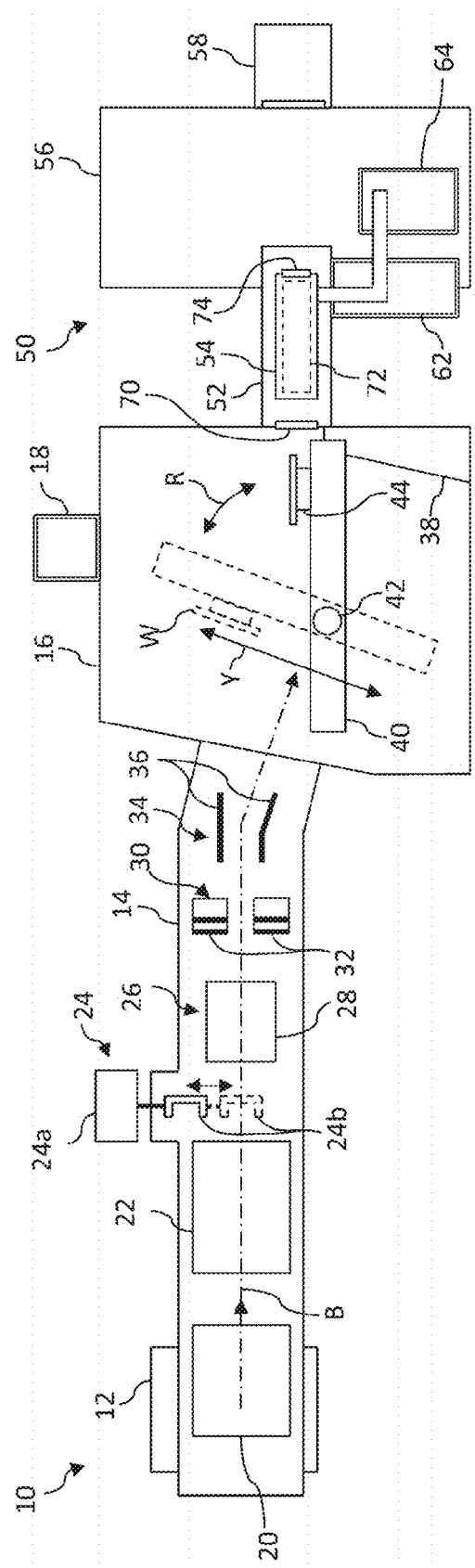
FIG. 2 is a side view that illustrates a schematic configuration of an ion implantation apparatus according to an embodiment.

FIG. 1 is a top view that illustrates a schematic configuration of an ion implantation apparatus 10 according to an embodiment, and FIG. 2 is a side view that illustrates a schematic configuration of the ion implantation apparatus 10 according to an embodiment.

The ion implantation apparatus 10 is configured to perform an ion implantation process for the surface of a processed object W. The processing object W, for example, is a substrate or, for example, is a semiconductor wafer. Hereinafter, while the processing object W may be referred to as a wafer W for the convenience of description, this is not intended to limit the target for the implantation process to a specific object.

The ion implantation apparatus 10 is configured to irradiate with an ion beam B over the entirety of the wafer W according to reciprocative scanning of the beam and reciprocative movement of the wafer W. Here, for the convenience of description, the designed traveling direction of the ion beam B is defined as a direction z, and a plane perpendicular to the direction z is defined as a plane xy. In a case where the ion beam B is scanned for the processing object W, the scanning direction of the beam is set as a direction x, and a direction perpendicular to the direction z and the direction x is set as a direction y. Accordingly, the reciprocative scanning of the beam is performed in the direction x, and the reciprocative movement of the wafer W is performed in the direction y.

The ion implantation apparatus 10 includes: an ion source 12; a beamline device 14; a vacuum processing chamber 16; and a wafer conveyance device 50. The ion source 12 is configured to supply the ion beam B to the beamline device 14. The beamline device 14 is configured to transport ions from the ion source 12 to the vacuum processing chamber 16. The ion implantation apparatus 10 includes an evacuation system that is used for providing a desired vacuum environment for the ion source 12, the beamline device 14, and the vacuum processing chamber 16.

The beamline device 14, for example, includes: amass analyzing unit 20; a beam focusing unit 22; a beam measurement unit 24; a beam scanner 26; a parallelizing lens 30 or a beam collimating device; and an angular energy filter (AEF) 34 in order from the upstream side. Here, the upstream side of the beamline device 14 represents a side close to the ion source 12, and the downstream side of the beamline device 14 represents a side close to the vacuum processing chamber 16 (or a beam stopper 38).

The mass analysis unit 20 is disposed at the downstream side of the ion source 12 and is configured to select a necessary ion species from an ion beam B extracted from the ion source 12 by a mass analysis. The beam converging unit 22 includes a focusing lens such as a quadrupole focusing device (Q lens) and is configured to shape the ion beam B passing through the mass analysis unit 20 into a desired cross-sectional shape by focusing the ion beam.

The beam measurement unit 24 is an injector flag Faraday cup that is disposed so as to move in or out on the beamline and measures the current of the ion beam. The beam measurement unit 24 includes: a faraday cup 24b that measures a beam current and a drive unit 24a that moves the faraday cup 24b up and down. As indicated by a dashed line in FIG. 2, in a case where the faraday cup 24b is arranged on a beamline, the ion beam B is blocked by the faraday cup 24b. On the other hand, as indicated by a solid line in FIG. 2, in a case where the faraday cup 24b is taken off from the beamline, the blocking of the ion beam B is cancelled.

The beam scanner 26 is configured to provide reciprocative scanning of the beam and is a deflection member that scans the shaped ion beam B in the direction x. The beam scanner 26 includes a pair of scanner electrodes 28 that are disposed to face each other in the direction x. The pair of the scanner electrodes 28 are connected to a variable voltage power supply (not illustrated in the figure), and, by periodically changing a voltage applied to the pair of the scanner electrodes 28, an electric field generated between the electrodes is changed so as to deflect the ion beam B at various angles. In this way, the ion beam B is scanned over the scan range extracting in the direction x. In FIG. 1, the scanning direction and the scan range of the ion beam are illustrated by an arrow X as an example, and a plurality of trajectories of the ion beam B in the scan range are denoted by chain lines.

The collimating lens 30 is configured to parallelize the traveling directions of the scanned ion beam B. The collimating lens 30 includes a plurality of P-lens electrodes 32 each having an arc shape that has a passage slit of the ion beam B at the center portion. Each P-lens electrode 32 is connected to a high-voltage power supply (not illustrated in the figure) and allows the traveling directions of the ion beam B to be parallel by applying the electric field generated by the application of the voltage to the ion beam B.

The angular energy filter (AEF) 34 is configured to analyze the energy of the ion beam B, deflect the ion having a necessary energy downward at an appropriate angle, and lead the ion to the vacuum processing chamber 16. The angular energy filter 34 includes a pair of AEF electrodes 36 used for deflection by an electric field, and the pair of AEF electrodes 36 are connected to a high-voltage power supply (not illustrated in the figure). In the case illustrated in FIG. 2, by applying a positive voltage to the upper AEF electrode and applying a negative voltage to the lower AEF electrode, the ion beam. B is deflected downward. Here, the angular energy filter 34 may be configured by a magnetic device used for deflection by a magnetic field or may be configured by a combination of a pair of AEF electrodes used for deflection by an electric field and a magnetic device used for deflection by a magnetic field.

In this way, the beamline device 14 supplies the ion beam B to be irradiated on the wafer W to the vacuum processing chamber 16.

The vacuum processing chamber 16 includes a wafer holder 44 that holds one or a plurality of wafers W. The wafer holder 44 is attached to a moving mechanism 40 that can linearly move the wafer holder 44 as is necessary. The moving mechanism 40 is configured to be rotatable in a direction indicated by an arrow R illustrated in FIG. 2 around a rotation shaft 42 at its center and is configured to be able to be displaced between a conveyance position (illustrated using solid lines) used for placing the wafer W4 on the wafer holder 44 and an implantation position (illustrated using dashed lines) used for implanting ions into the wafer W. The moving mechanism 40 causes the wafer holder 44 to reciprocate so as to provide relative movement (for example, in the direction y) with respect to the ion beam B for the wafer W as is necessary when the ions are implanted. In FIG. 2, a reciprocating motion of the wafer W is illustrated using an arrow Y.

The vacuum processing chamber 16 includes a beam stopper 38. In a case where the wafer W is not present in the beam trajectory, the ion beam B is incident into the beam stopper 38. In addition, a first evacuation device 18 is connected to the vacuum processing chamber 16. In a steady state in which wafer processing is not performed, the first evacuation device 18 is an evacuation device that realizes a high vacuum state of $10^{-3}$ Pa or less, for example, and is configured by a cryopump or the like.

The wafer conveyance device 50 includes: an intermediate conveyance chamber 52; a load lock chamber 54 (54a and 54b); and an atmosphere conveyance unit 56. The wafer conveyance device 50 is configured to convey wafers stored in a cassette station 58 (58a and 58b) to the vacuum processing chamber 16. The wafers, for example, as wafers W1 to W4 illustrated in FIG. 1, are brought into the vacuum processing chamber 16 from the cassette station 58 through the atmosphere conveyance unit 56, the load lock chamber 54, and the intermediate conveyance chamber 52. Meanwhile, the wafer W for which the ion implantation process has been performed is taken out to the cassette station 58 through the intermediate conveyance chamber 52, the load lock chamber 54, and the atmosphere conveyance unit 56.

A second evacuation device 62 that is configured by a turbo molecular pump or the like is connected to the intermediate conveyance chamber 52, and, in a steady state in which wafer processing is not performed, the intermediate conveyance chamber 52 is maintained to be in a middle to high vacuum state of about $10^{-1}$ Pa. The atmosphere conveyance unit 56 is kept under the atmospheric pressure and conveys a wafer in the atmosphere. The load lock chamber 54 is a chamber that is partitioned for realizing the conveyance of a wafer between the intermediate conveyance chamber 52 that is maintained in the vacuum state and the atmosphere conveyance unit 56 that is under the atmospheric pressure. A third evacuation device 64 is connected to the load lock chamber 54, and the load lock chamber 54 is configured to enable vacuum evacuation and release to the atmosphere (venting) when the wafer is conveyed. The third evacuation device 64, for example, is configured by a roughing vacuum pump such as an oil-sealed rotary vacuum pump or a dry vacuum pump.

In addition, in each of the vacuum processing chamber 16, the intermediate conveyance chamber 52, and the load lock chamber 54 that can be evacuated, a pressure sensor that can measure the chamber pressure may be installed. Furthermore, the ion implantation apparatus 10 may include a pressure control device (not illustrated in the figure) that can independently control the pressure of each chamber. The pressure control device may be configured to control the pressure of each of the vacuum processing chamber 16, the intermediate conveyance chamber 52, and the load lock chamber 54 by controlling the operations of an evacuation device and a pressure sensor connected to each chamber, a gate valve disposed in each communication mechanism that enables corresponding chambers to communicate with each other, and the like.

In this embodiment, the wafer conveyance device 50 is disposed to be adjacent to the vacuum processing chamber 16 in a direction in which the beamline device 14 extends. The intermediate conveyance chamber 52 is disposed to be adjacent to the vacuum processing chamber 16 in the direction in which the beamline device 14 extends. The load lock chamber 54 is disposed to be adjacent to the intermediate conveyance chamber 52 in a direction perpendicular to the direction in which the beamline device 14 extends. For example, on a sheet of FIG. 1, the vacuum processing chamber 16 and the intermediate conveyance chamber 52 are disposed to be adjacent to each other in a right or left direction in which the beamline device 14 extends, and the intermediate conveyance chamber 52 and the load lock chamber 54 are disposed to be adjacent to each other in an upper or lower direction perpendicular to the right or left direction.

In addition, in this embodiment, the wafer conveyance device 50 includes two load lock chambers 54 that are disposed with the intermediate conveyance chamber 52 being interposed there between and includes a first load lock chamber 54a and a second load lock chamber 54b. The first load lock chamber 54a includes a first load lock chamber-intermediate conveyance chamber communication mechanism 72a that is disposed between the intermediate conveyance chamber 52 and the first load lock chamber 54a and a first load lock chamber-atmosphere conveyance unit communication mechanism 74a that is disposed between the atmosphere conveyance unit 56 and the first load lock chamber 54a. The second load lock chamber 54b includes a second load lock chamber-intermediate conveyance chamber communication mechanism 72b that is disposed between the intermediate conveyance chamber 52 and the second load lock chamber 54b and a second load lock chamber-atmosphere conveyance unit communication mechanism 74b that is disposed between the atmosphere conveyance unit 56 and the second load lock chamber 54b. By arranging two load lock chambers 54, in a case where a plurality of wafers are sequentially conveyed or the like, a time required for conveying one wafer can be shortened. In another embodiment, only one load lock chamber 54 may be disposed, or three or more load lock chambers 54 may be disposed.

The load lock chamber 54 includes a load lock chamber-intermediate conveyance chamber communication mechanism 72 (72a and 72b) used for communicating with the intermediate conveyance chamber 52 and a load lock chamber-atmosphere conveyance unit communication mechanism 74 (74a and 74b) used for communicating with the atmosphere conveyance unit 56. In each of the load lock chamber-intermediate conveyance chamber communication mechanism 72 and the load lock chamber-atmosphere conveyance unit communication mechanism 74, a gate valve is disposed to form the load lock chamber 54 as a sealed space. For example, in the load lock chamber-intermediate conveyance chamber communication mechanism 72, a gate valve capable of sealing a load lock chamber-intermediate conveyance chamber communication port is disposed.

Figure 3:
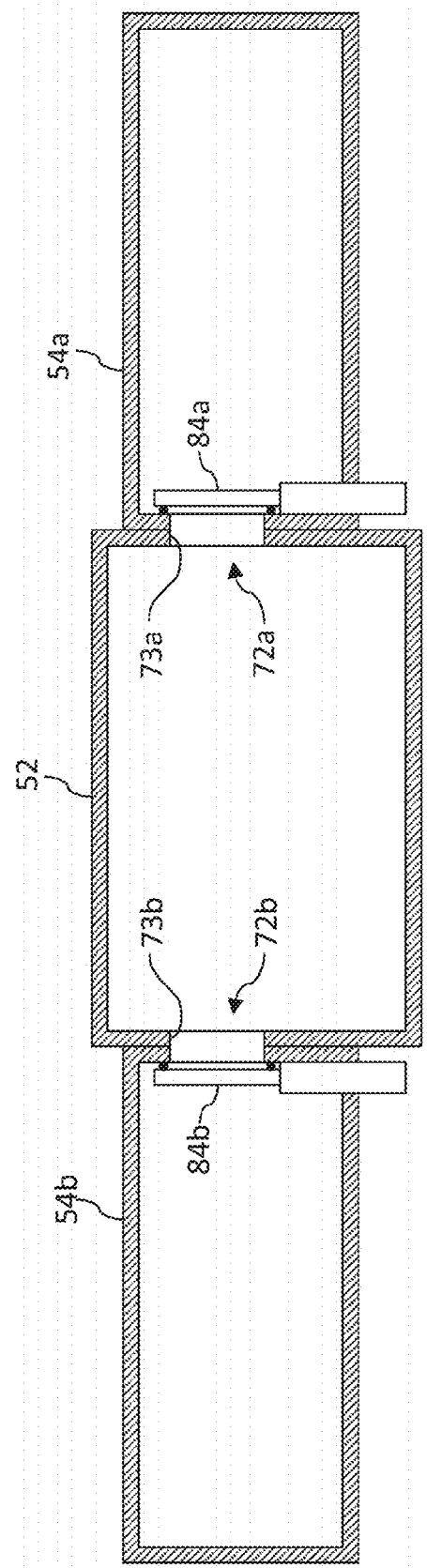
FIG. 3 is a cross-sectional view that illustrates a schematic configuration of an intermediate conveyance chamber and load lock chambers.

FIG. 3 is a cross-sectional view that illustrates a schematic configuration of the intermediate conveyance chamber 52 and the load lock chambers 54a and 54b and corresponds to a cross-sectional view taken along line A-A illustrated in FIG. 1. As illustrated in the figure, in the first load lock chamber-intermediate conveyance chamber communication mechanism 72a, disposed are a first load lock chamber-intermediate conveyance chamber communication port 73a that enables wafer conveyance by causing the intermediate conveyance chamber 52 and the first load lock chamber 54a to communicate with each other and a gate valve 84a that enables the first load lock chamber-intermediate conveyance chamber communication port 73a to be sealed. Similarly, in the second load lock chamber-intermediate conveyance chamber communication mechanism 72b, disposed are a second load lock chamber-intermediate conveyance chamber communication port 73b that enables wafer conveyance by causing the intermediate conveyance chamber 52 and the second load lock chamber 54b to communicate with each other and a gate valve 84*b* that enables the second load lock chamber-intermediate conveyance chamber communication port 73*b* to be sealed.

In order to evacuate the load lock chamber 54 or release the load lock chamber 54 to the atmosphere, the gate valves in the load lock chamber-intermediate conveyance chamber communication mechanism 72 and the load lock chamber-atmosphere conveyance unit communication mechanism 74 are closed. On the other hand, in order to convey a wafer between the intermediate conveyance chamber 52 and the load lock chamber 54, the gate valve disposed in the load lock chamber-intermediate conveyance chamber communication mechanism 72 is open, and the gate valve disposed in the load lock chamber-atmosphere conveyance unit communication mechanism 74 is in the closed state. In addition, in order to convey a wafer between the atmosphere conveyance unit 56 and the load lock chamber 54, the gate valve disposed in the load lock chamber-atmosphere conveyance unit communication mechanism. 74 is open, and the gate valve disposed in the load lock chamber-intermediate conveyance chamber communication mechanism 72 is in the closed state.

Referring back to FIG. 1, the atmosphere conveyance unit 56 includes atmosphere conveyance robots 92*a* and 92*b* that are used for bringing wafers stored in the cassette station 58 into the load lock chamber 54. The atmosphere conveyance unit 56 includes the first atmosphere conveyance robot 92*a* used for conveying wafers to the first load lock chamber 54*a* and a second atmosphere conveyance robot 92*b* used for conveying wafers to the second load lock chamber 54*b*. The first atmosphere conveyance robot 92*a* may be configured to convey wafers drawn out from one pair of the cassette stations 58*a* arranged on the upper side in FIG. 1 to the first load lock chamber 54*a*. In addition, the second atmosphere conveyance robot 92*b* may be configured to convey wafers drawn out from one pair of the cassette stations 58*b* arranged on the lower side in FIG. 1 to the second load lock chamber 54*b*. Here, the configurations of the atmosphere conveyance robots 92*a* and 92*b* illustrated in the figure are examples, and the atmosphere conveyance unit 56 may include a conveyance mechanism having a different configuration that realizes wafer conveyance between the cassette stations 58 and the load lock chamber 54. In addition, the atmosphere conveyance unit 56 may be configured to include an aligner used for adjusting a notch position of a wafer drawn out from the cassette station 58.

The intermediate conveyance chamber 52 is disposed to be adjacent to the vacuum processing chamber 16, the first load lock chamber 54*a*, and the second load lock chamber 54*b*. Between the intermediate conveyance chamber 52 and the vacuum processing chamber 16, an intermediate conveyance chamber-vacuum processing chamber communication mechanism 70 used for conveying wafers is disposed, and, between the intermediate conveyance chamber 52 and the load lock chamber 54 (54*a* and 54*b*), a load lock chamber-intermediate conveyance chamber communication mechanism 72 (72*a* and 72*b*) used for conveying wafers is disposed.

Figure 4:
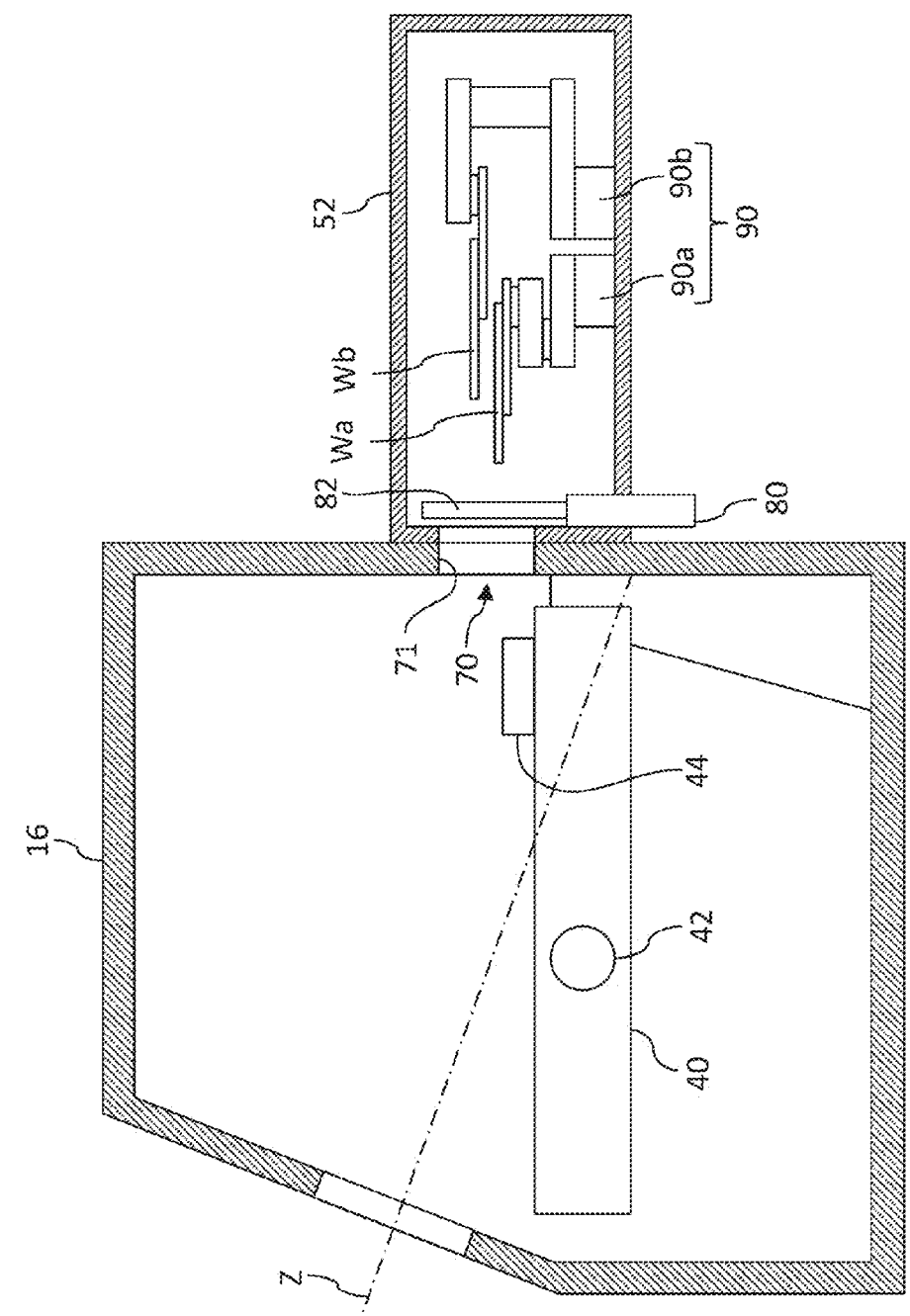
FIG. 4 is a cross-sectional view that illustrates a schematic configuration of a vacuum processing chamber and an intermediate conveyance chamber.

FIG. 4 is a cross-sectional view that illustrates a schematic configuration of the vacuum processing chamber 16 and the intermediate conveyance chamber 52 and corresponds to a side view illustrated in FIG. 2. The intermediate conveyance chamber 52 includes an intermediate conveyance robot 90 as a conveyance mechanism that realizes wafer conveyance between the load lock chamber 54 and the vacuum processing chamber 16. In this embodiment, as the intermediate conveyance robot 90, two intermediate conveyance robots 90*a* and 90*b* are included. The intermediate conveyance robots 90, as illustrated in the figure, are configured such that a wafer Wa conveyed by the first intermediate conveyance robot 90*a* and a wafer Wb conveyed by the second intermediate conveyance robot 90*b* have mutually-different heights in the vertical direction. By arranging the two intermediate conveyance robots at mutually different heights, both a process of bringing a wafer before the ion implantation process into the vacuum processing chamber 16 and a process of taking out a wafer for which the ion implantation process has been performed from the vacuum processing chamber 16 can be performed at the same timing. Accordingly, a time required for conveying a wafer is shortened, whereby the wafer conveyance capability can be improved.

The intermediate conveyance chamber-vacuum processing chamber communication mechanism 70 includes: an intermediate conveyance chamber-vacuum processing chamber communication port 71; and a shielding plate 82. The intermediate conveyance chamber-vacuum processing chamber communication port 71 is an opening that establishes communication between the intermediate conveyance chamber and the vacuum processing chamber. The intermediate conveyance chamber-vacuum processing chamber communication port 71 has such a size that an arm of the intermediate conveyance robot 90 and a wafer conveyed by the intermediate conveyance robot 90 can pass through it. The intermediate conveyance chamber-vacuum processing chamber communication port 71 is disposed at a position avoiding positions located on the trajectory Z of the ion beam transported to the vacuum processing chamber 16 and, for example, is disposed at a position deviating from the trajectory Z of the ion beam in the direction y (vertical direction) perpendicular to the trajectory Z. In this embodiment, the intermediate conveyance chamber-vacuum processing chamber communication port 71 is disposed on the upper side of the trajectory Z of the ion beam. By arranging the intermediate conveyance chamber-vacuum processing chamber communication port 71 to deviate from the trajectory Z of the ion beam, it becomes difficult for ions included in the ion beam to flow into the intermediate conveyance chamber 52.

The shielding plate 82 shields at least a part of the intermediate conveyance chamber-vacuum processing chamber communication port 71. The shielding plate 82 is configured to be driven by an opening/closing device 80 and to be changeable between an open position and a closed position. In this embodiment, the shielding plate 82 has shutter structure movable in the vertical direction, and the opening/closing device 80 and the shielding plate 82 are disposed inside the intermediate conveyance chamber 52. In addition, the opening/closing device 80 and the shielding plate 82, as illustrated in a modified example to be described later, may have a structure other than the shutter structure and may be disposed not in the intermediate conveyance chamber 52 but in the vacuum processing chamber 16.

FIG. 4 illustrates the shielding plate 82 at the closed position, and the shielding plate 82 is located at a position that shields at least a part of the intermediate conveyance chamber-vacuum processing chamber communication port 71. In FIG. 4, while a state in which the shielding plate 82 is arranged to completely shield the intermediate conveyance chamber-vacuum processing chamber communication port 71 is illustrated as the closed position, a state in which there is a gap between the inner wall of the intermediate conveyance chamber 52 and the shielding plate 82, and apart of the intermediate conveyance chamber-vacuum processing chamber communication port 71 is not shielded may be set as the closed position. The shielding plate 82 may be configured to be able to seal the intermediate conveyance chamber-vacuum processing chamber communication port 71 at the closed position or may be configured not to seal the intermediate conveyance chamber-vacuum processing chamber communication port 71 at the closed position. In a case where the shielding plate 82 is configured to be able to seal the intermediate conveyance chamber-vacuum processing chamber communication port 71, the shielding plate 82 may be a gate valve.

Figure 5:
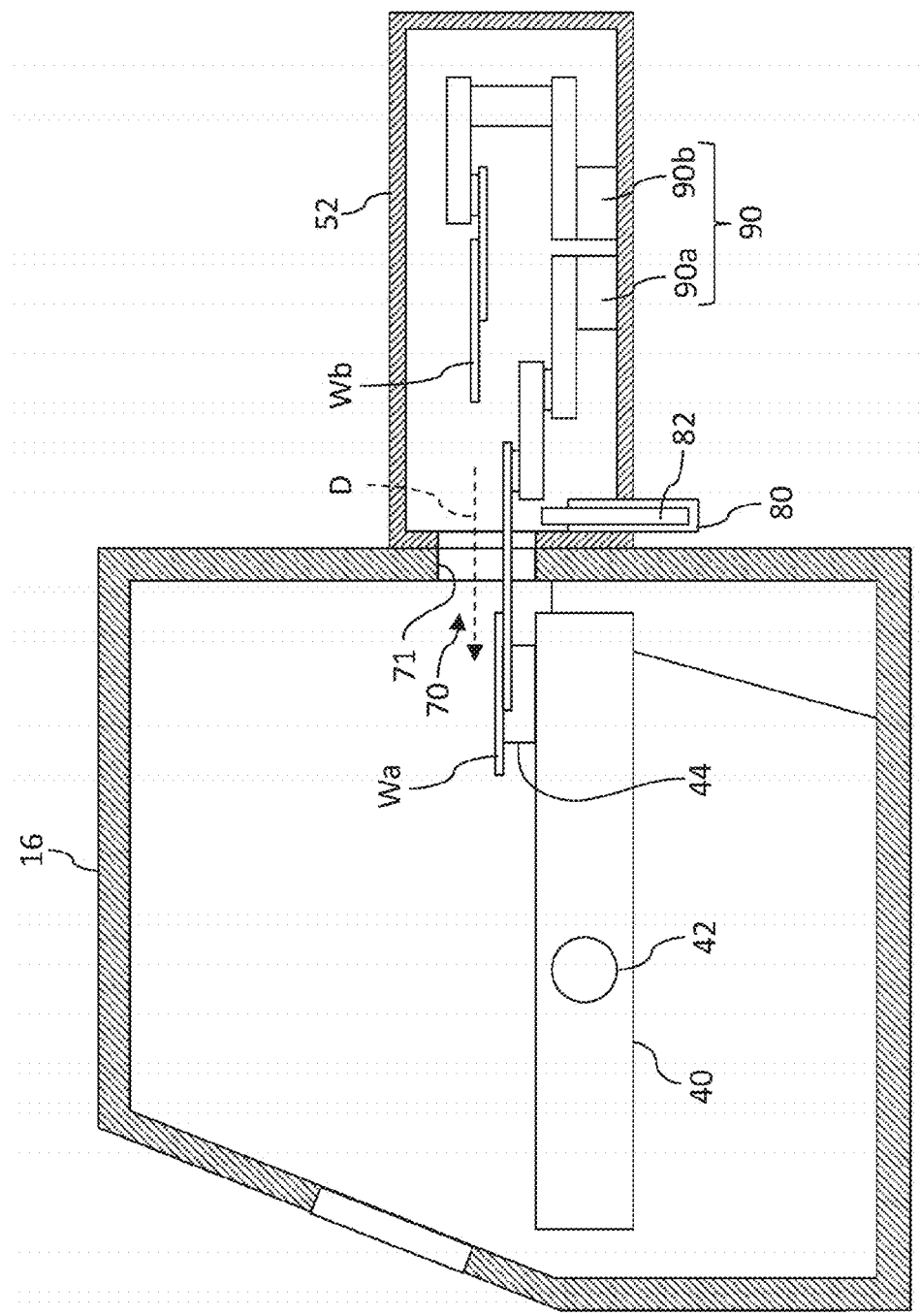
FIG. 5 is a schematic diagram that illustrates the appearance of conveyance of a wafer from the intermediate conveyance chamber to the vacuum processing chamber.

FIG. 5 is a schematic diagram that illustrates the appearance of conveyance of a wafer from the intermediate conveyance chamber 52 to the vacuum processing chamber 16 and illustrates the shielding plate 82 at the open position. The intermediate conveyance robot 90, in the state in which the shielding plate 82 is located at the open position, conveys the wafer Wa in the conveyance direction indicated by an arrow D and brings the wafer Wa from the intermediate conveyance chamber 52 into the vacuum processing chamber 16. The wafer Wa that has been brought into the vacuum processing chamber 16 is set in the wafer holder 44 attached the moving mechanism 40.

The opening/closing device 80 moves the shielding plate 82 from the closed position illustrated in FIG. 4 to an open position illustrated in FIG. 5 by moving the shielding plate 82 in a direction perpendicular to the conveyance direction D. The shielding plate 82 at the open position is located at a place not blocking the conveyance of the wafer Wa between the intermediate conveyance chamber 52 and the vacuum processing chamber 16. The shielding plate 82 at the open position, for example, as illustrated in FIG. 5, is located at a position not shielding the intermediate conveyance chamber-vacuum processing chamber communication port 71. In addition, the shielding plate 82 at the open position may be located at a position shielding a part of the intermediate conveyance chamber-vacuum processing chamber communication port 71 as long as the position is located at a position not blocking the conveyance of the wafer Wa.

Figure 6:
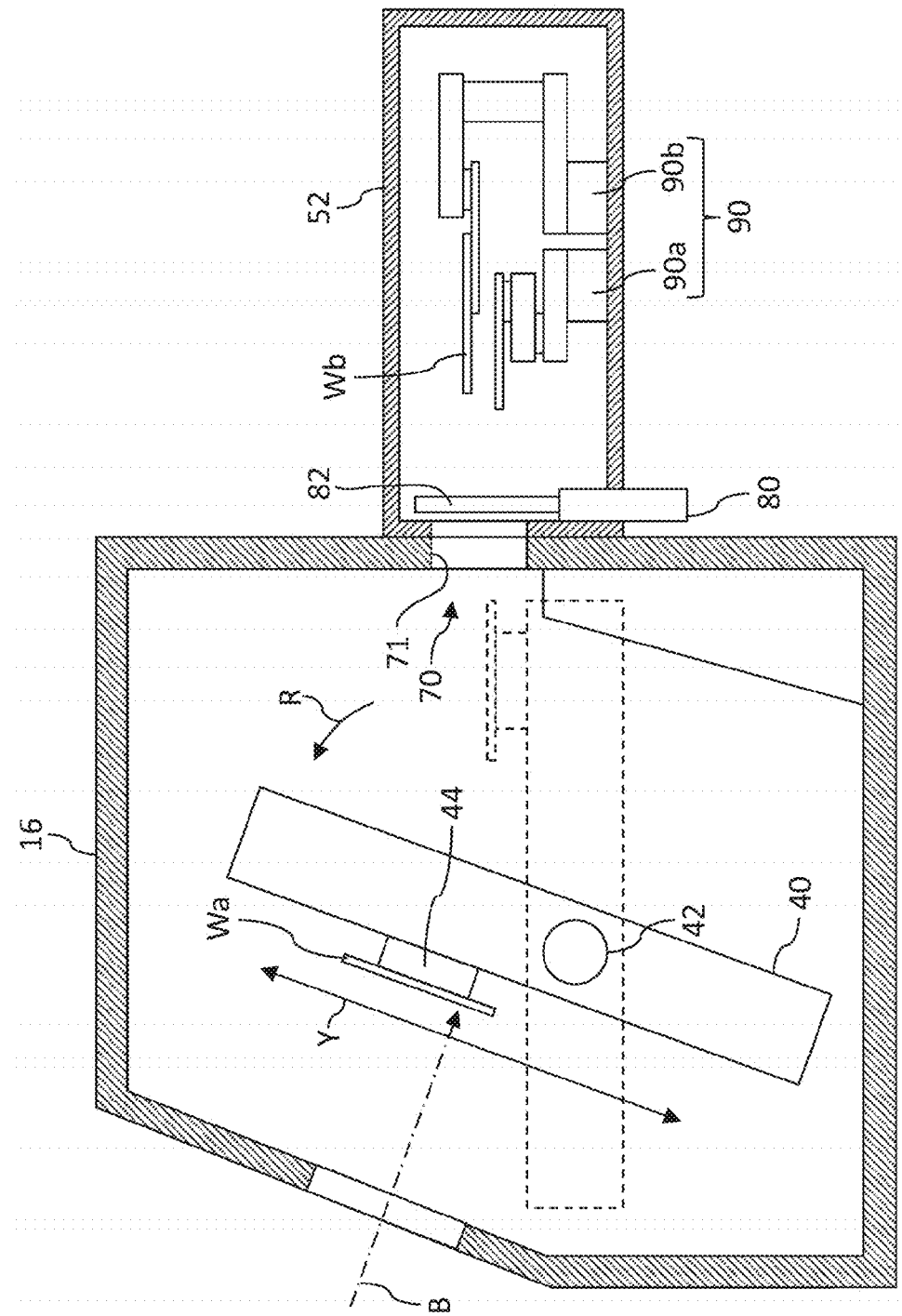
FIG. 6 is a schematic diagram that illustrates the appearance of an ion implantation process for a wafer.

FIG. 6 is a schematic diagram that illustrates the appearance of an ion implantation process for the wafer Wa. When the conveyance of the wafer to the vacuum processing chamber 16 is completed by the intermediate conveyance robot 90, the shielding plate 82 is returned to the closed position. In addition, the moving mechanism 40 in which the wafer Wa is placed is moved in a direction R from a conveyance position (illustrated using dashed lines) for placing the wafer Wa to an implantation position (illustrated using solid lines) for implanting ions into the wafer Wa. The wafer Wa arranged at the implantation position reciprocates in the direction Y by the moving mechanism 40, and the ion implantation process for the whole surface of the wafer Wa is performed by irradiating with the ion beam B.

In this way, the shielding plate 82 is set to the open position when the wafer is conveyed between the intermediate conveyance chamber 52 and the vacuum processing chamber 16, and the shielding plate 82 is set to the closed position when the ion implantation process is performed in the vacuum processing chamber 16. Accordingly, while the ion implantation process is performed in the vacuum processing chamber 16, ions included in the ion beam transported to the vacuum processing chamber 16, particles sputtered by the ion beam, and the like are prevented from flowing into the intermediate conveyance chamber 52.

In addition, the shielding plate 82 may be configured to be opened from the closed position to the open position before the wafer conveyance between the intermediate conveyance chamber and the vacuum processing chamber is started, and to be closed from the open position to the closed position after the wafer conveyance between the intermediate conveyance chamber and the vacuum processing chamber is completed. In such a case, the shielding plate 82 is located at the open position only during the process of the wafer conveyance, and accordingly, a time during which the intermediate conveyance chamber-vacuum processing chamber communication port 71 is not shielded can be further shortened. Accordingly, the inflow of ions, particles, and the like into the intermediate conveyance chamber 52 can be further reduced.

Figure 7:
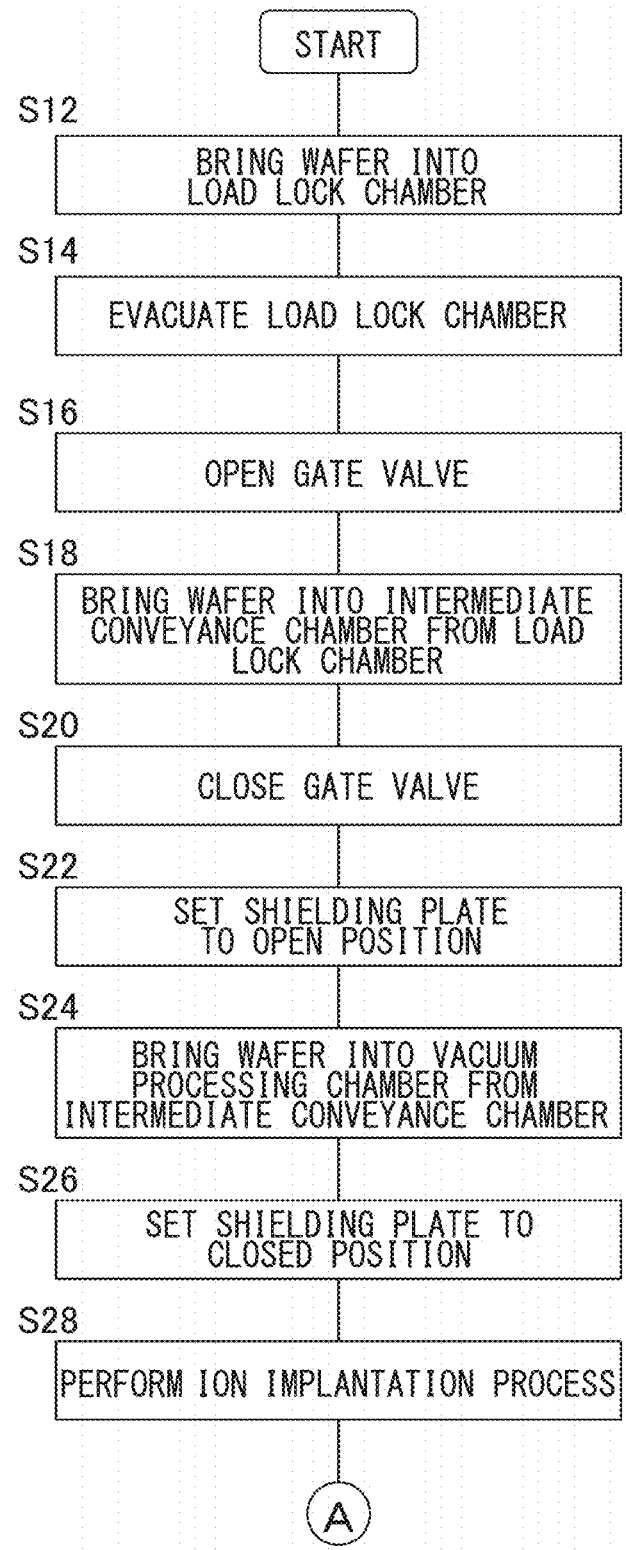
FIG. 7 is a flowchart that illustrates the operation of the ion implantation apparatus at the time of conveying a wafer.
Figure 8:
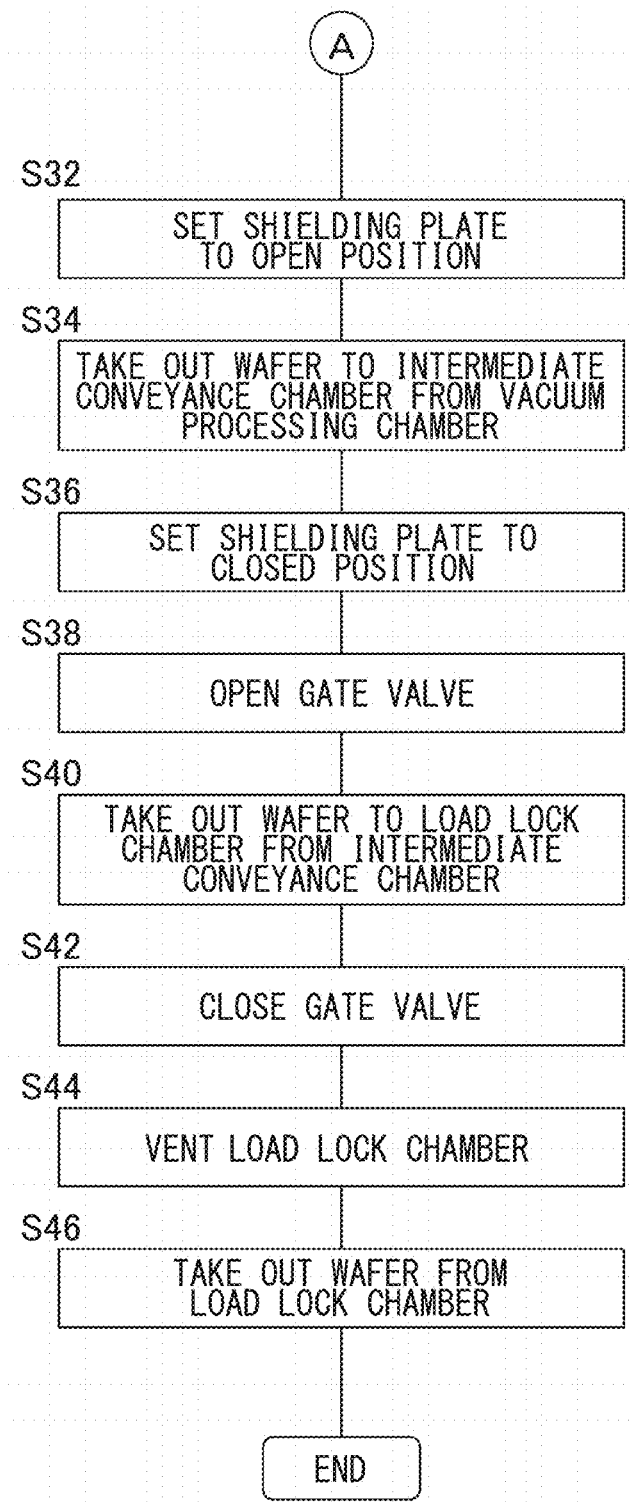
FIG. 8 is a flowchart that illustrates the operation of the ion implantation apparatus at the time of conveying the wafer.

Subsequently, the flow of the operation of the ion implantation apparatus 10 at the time of conveying a wafer will be described. FIGS. 7 and 8 are flowcharts that illustrate the operation of the ion implantation apparatus 10 at the time of conveying a wafer.

A wafer for which the ion implantation process is to be performed is brought into the load lock chamber 54 through the load lock chamber-atmosphere conveyance unit communication mechanism 74 (S12), and the gate valve in the load lock chamber-atmosphere conveyance unit communication mechanism 74 is closed, and the load lock chamber 54 is evacuated (S14). When the evacuation is completed, the gate valve in the load lock chamber-intermediate conveyance chamber communication mechanism 72 is opened (S16), and the wafer is brought into the intermediate conveyance chamber 52 from the load lock chamber 54 (S18). When the wafer is completed to be brought into the intermediate conveyance chamber 52, the gate valve in the load lock chamber-intermediate conveyance chamber communication mechanism 72 is closed (S20), and the shielding plate 82 is moved from the closed position to the open position (S22). The wafer is brought into the vacuum processing chamber 16 from the intermediate conveyance chamber 52 in the state in which the shielding plate 82 is set to the open position (S24), and, when the wafer is completed to be brought into the vacuum processing chamber 16, the shielding plate 82 is returned from the open position to the closed position (S26). Thereafter, the moving mechanism 40 is set to the implantation position, and the ion implantation process is started (S28).

FIG. 8 illustrates operations following the process of S28 illustrated in FIG. 7. When the ion implantation process is completed, the moving mechanism 40 is returned to the conveyance position, and the shielding plate 82 is moved to the open position (S32), and the wafer is taken out from the vacuum processing chamber 16 to the intermediate conveyance chamber 52 (S34). When the wafer is completed to be taken out to the intermediate conveyance chamber 52, the shielding plate 82 is returned to the closed position from the open position (S36). The gate valve in the load lock chamber-intermediate conveyance chamber communication mechanism 72 is opened (S38), and the wafer is taken out from the intermediate conveyance chamber 52 to the load lock chamber 54 (S40). Then, the gate valve in the load lock chamber-intermediate conveyance chamber communication mechanism 72 is closed (S42), the load lock chamber 54 is vented (S44), and the wafer is taken out from the load lock chamber 54 through the load lock chamber-atmosphere conveyance unit communication mechanism 74 (S46).

Subsequently, the advantages acquired by the ion implantation apparatus 10 according to this embodiment will be described.

Figure 9:
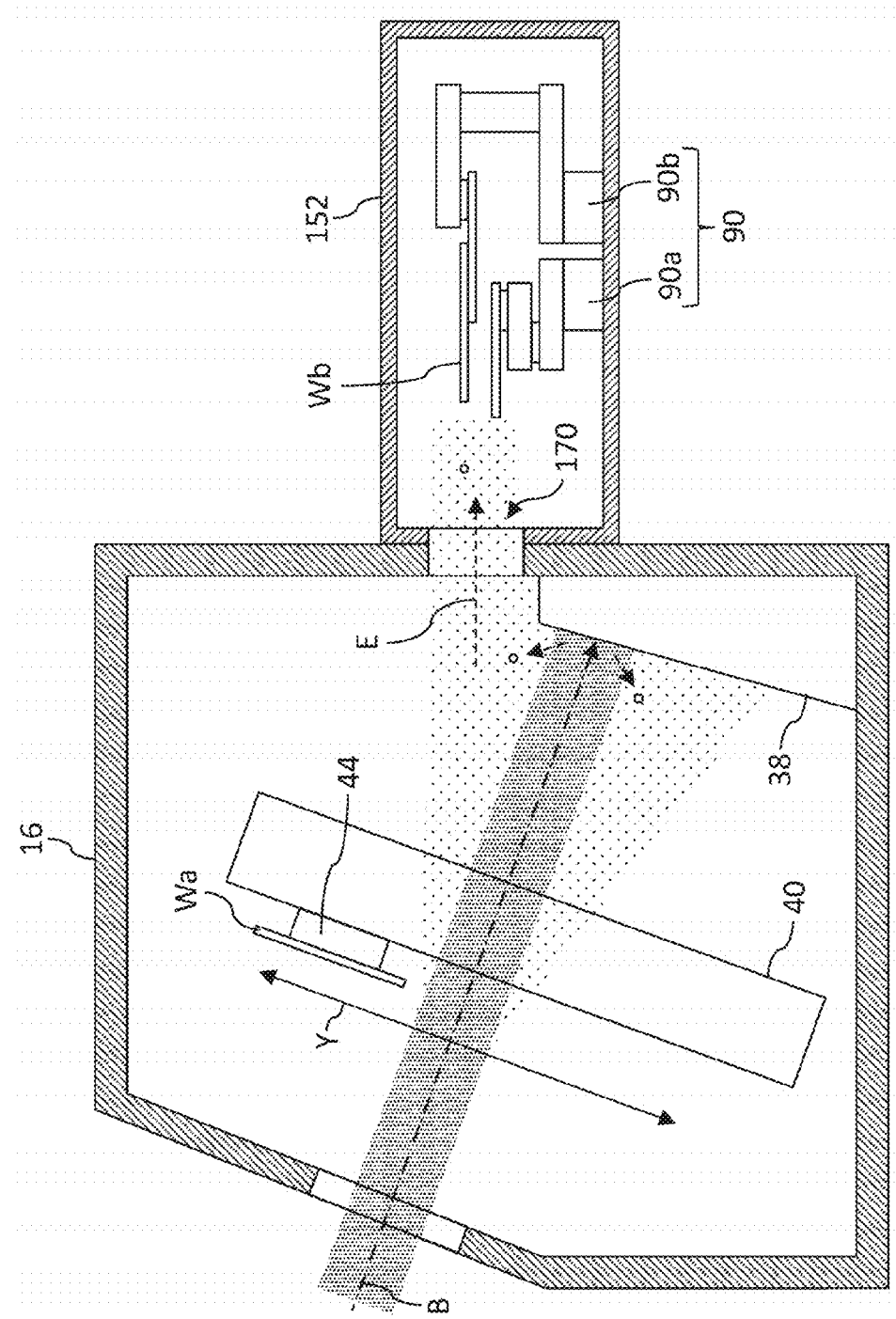
FIG. 9 is a schematic diagram that illustrates a vacuum processing chamber and an intermediate conveyance chamber according to a comparative example.

FIG. 9 is a schematic diagram that illustrates a vacuum processing chamber 16 and an intermediate conveyance chamber 152 according to a comparative example. The intermediate conveyance chamber 152 according to the comparative example has the same configuration as that of the intermediate conveyance chamber 52 according to this embodiment except that a shielding plate is not disposed in an intermediate conveyance chamber-vacuum processing chamber communication mechanism 170. FIG. 9 illustrates the appearance of an ion implantation process for a wafer Wa and corresponds to the appearance illustrated in FIG. 6 described above.

An ion beam B transported to a vacuum processing chamber 16 is irradiated on the wafer Wa and is incident into the wall surface of a vacuum processing chamber 16 such as a beam stopper 38 and sputters the wall surface, thereby generating particles. Ions scattered from the ion beam B and/or particles generated through sputtering in the vacuum processing chamber 16, as denoted by an arrow E, flow into the inside of an intermediate conveyance chamber 152 through the intermediate conveyance chamber-vacuum processing chamber communication mechanism 170. In the comparative example, since a shielding plate is not disposed in the intermediate conveyance chamber-vacuum processing chamber communication mechanism 170, ions and particles may flow into the intermediate conveyance chamber 152 and contaminate the intermediate conveyance robot 90 and/or a wafer Wb that is during the conveyance process. In such a case, the device yield may decrease due to the influence of the contamination of the wafer. In addition, when the intermediate conveyance chamber 152 and/or the intermediate conveyance robot 90 and to be cleaned so as to prevent the contamination of the wafer, it is necessary to stop the ion implantation apparatus for the maintenance, whereby the productivity of the ion implantation process decreases.

According to this embodiment, since the shielding plate 82 is disposed in the intermediate conveyance chamber-vacuum processing chamber communication mechanism 70, the inflow of ions and particles into the intermediate conveyance chamber 52 can be reduced. In a case where the shielding plate 82 is configured to be sealable, by closing the intermediate conveyance chamber-vacuum processing chamber communication port 71 using the shielding plate 82, the inflow of ions and particles can be prevented. In addition, also in a case where the shielding plate 82 shields a part of the intermediate conveyance chamber-vacuum processing chamber communication mechanism 70, by narrowing the passage of the intermediate conveyance chamber-vacuum processing chamber communication port 71, the inflow of ions and particles can be reduced. Accordingly, the influence of the contamination of the wafer can be reduced.

In addition, according to this embodiment, since the shielding plate 82 is disposed in the intermediate conveyance chamber-vacuum processing chamber communication mechanism 70, the influence of a variation of the pressure in the vacuum processing chamber 16 can be reduced. Here, the variation of the pressure is an increase of the pressure by opening the gate valve in the load lock chamber-intermediate conveyance chamber communication mechanism 72 so as to convey the wafer from the load lock chamber 54 to the intermediate conveyance chamber 52. In this embodiment, in the steady state in which wafer processing is not performed, the vacuum processing chamber 16 is commonly maintained to be in a high vacuum state of $10^{-3}$ Pa or less by the first evacuation device 18. In addition, in the steady state in which wafer processing is not performed, the intermediate conveyance chamber 52 is commonly maintained to be in a middle to high vacuum state of $10^{-1}$ Pa or less by the second evacuation device 62. Meanwhile, since the third evacuation device 64 connected to the load lock chamber 54 may have insufficient evacuation capability to realize a high vacuum state, the load lock chamber 54 communicates with the intermediate conveyance chamber 52 in a rough pumping state of about $10^{1}$ Pa, for example. Therefore, by opening the gate valve of the load lock chamber-intermediate conveyance chamber communication mechanism 72, the pressure of the intermediate conveyance chamber 52 increases.

In the comparative example illustrated in FIG. 9, since no shielding plate is disposed in the intermediate conveyance chamber-vacuum processing chamber communication mechanism 170, when the pressure in the intermediate conveyance chamber 152 increases by opening the gate valve in the load lock chamber-intermediate conveyance chamber communication mechanism 72, the vacuum processing chamber 16 is influenced by the variation of the pressure in the intermediate conveyance chamber 152. When the pressure of the vacuum processing chamber 16 changes, it has an influence on the transport of the ion beam to the wafer and/or the measurement of the ion beam, and accordingly, the ion implantation process may be unable to be started depending on a pressure value. In such a case, the start of the ion implantation process needs to be waited until the degree of vacuum in the vacuum processing chamber 16 becomes higher than a specified value, whereby the productivity of the ion implantation process decreases.

According to this embodiment, since the shielding plate 82 is disposed in the intermediate conveyance chamber-vacuum processing chamber communication mechanism 70, the influence of a variation of the pressure caused by the opening of the gate valve in the load lock chamber-intermediate conveyance chamber communication mechanism 72 can be reduced. In a case where the shielding plate 82 is configured to be sealable, the influence of a variation of the pressure caused by the opening of the gate valve in the load lock chamber-intermediate conveyance chamber communication mechanism 72 can be confined in the intermediate conveyance chamber 52. In addition, also in a case where the shielding plate 82 shields a part of the intermediate conveyance chamber-vacuum processing chamber communication mechanism 70, the conductance of the intermediate conveyance chamber-vacuum processing chamber communication port 71 can be decreased, and accordingly, it may become less likely to occur that the pressure variation caused by the opening of the gate valve in the load lock chamber-intermediate conveyance chamber communication mechanism 72 influences the vacuum processing chamber 16. Accordingly, an increase of the pressure in the vacuum processing chamber 16 caused by the wafer conveyance is reduced, and the productivity of the ion implantation process can be improved.

In addition, when the wafer is conveyed from the load lock chamber 54 to the vacuum processing chamber 16 through the intermediate conveyance chamber 52, the degree of vacuum in the intermediate conveyance chamber 52 may be improved, by using a time until the shielding plate 82 in the intermediate conveyance chamber-vacuum processing chamber communication mechanism 70 is opened after closing the gate valve in the load lock chamber-intermediate conveyance chamber communication mechanism 72. By closing the gate valve in the load lock chamber-intermediate conveyance chamber communication mechanism 72 disposed between the load lock chamber 54 and the intermediate conveyance chamber 52 after the wafer is brought into the intermediate conveyance chamber 52, the degree of vacuum in the intermediate conveyance chamber 52 can be improved by using the second evacuation device 62. Thereafter, by opening the shielding plate 82 at a time point when the degree in vacuum of the intermediate conveyance chamber 52 is sufficiently improved, the influence of a variation of the pressure in the vacuum processing chamber 16 caused by the communication between the vacuum processing chamber 16 and the intermediate conveyance chamber 52 can be further reduced.

Furthermore, according to this embodiment, also in the middle of the process of ion implantation, the wafer can be conveyed between the intermediate conveyance chamber 52 and the load lock chamber 54 while a variation of the pressure in the vacuum processing chamber 16 is suppressed. In the comparative example illustrated in FIG. 9, since no shielding plate is disposed in the intermediate conveyance chamber-vacuum processing chamber communication mechanism 170, if the gate valve in the load lock chamber-intermediate conveyance chamber communication mechanism 72 is opened in the middle of the ion implantation process, the vacuum processing chamber 16 is influenced by the variation of the pressure, and there is an influence on the ion implantation process. On the other hand, according to this embodiment, since the shielding plate 82 is disposed in the intermediate conveyance chamber-vacuum processing chamber communication mechanism 70, also in the middle of the process of ion implantation, the wafer can be conveyed between the intermediate conveyance chamber 52 and the load lock chamber 54. Accordingly, also in the middle of the process of ion implantation, without temporarily stopping the implantation process, a wafer for which the process has been completed can be taken out from the intermediate conveyance chamber 52, and a wafer to be implanted into in the next implantation process can be brought into the intermediate conveyance chamber 52. Accordingly, the productivity of the ion implantation process can be improved.

Described above is an explanation based on the exemplary embodiments of the present invention. The invention is not limited to the above-mentioned embodiments, and an appropriate combination or substitution of the configuration of each embodiment is also within the scope of the present invention. In addition, based on the knowledge of those skilled in the art, appropriate rearrangement of the combination or the sequence of the process in each embodiment or changes in forms such as various design changes may be added to the embodiment, and the embodiment to which such a change has been added is also within the scope of the present invention.

Figure 10A:
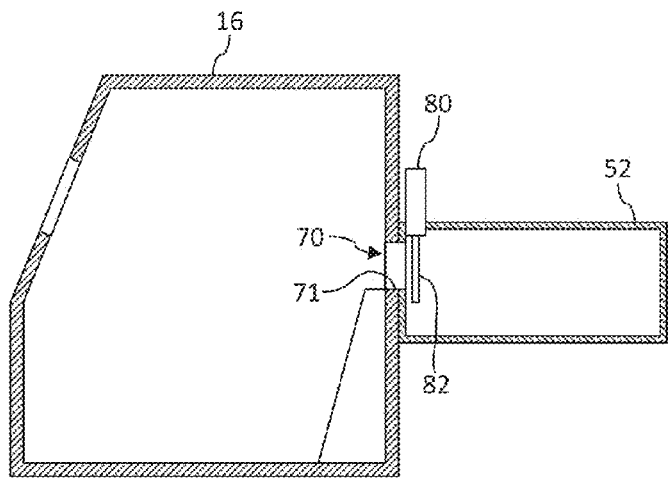
FIGS. 10A to 10C are cross-sectional views that illustrate schematic configurations of a vacuum processing chamber and an intermediate conveyance chamber according to modified examples.
Figure 10B:
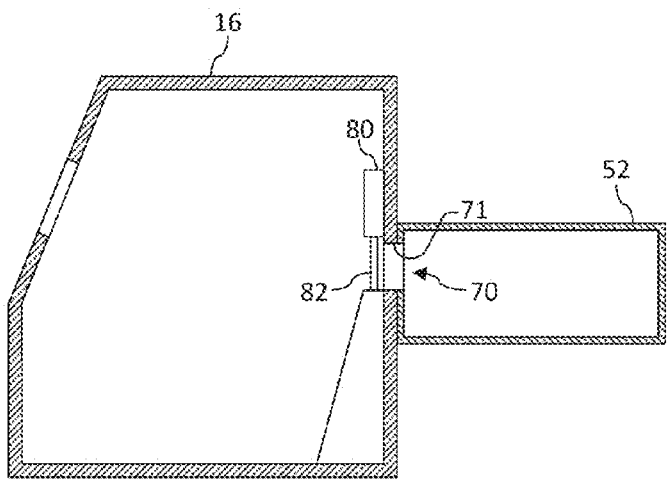
Figure 10C:
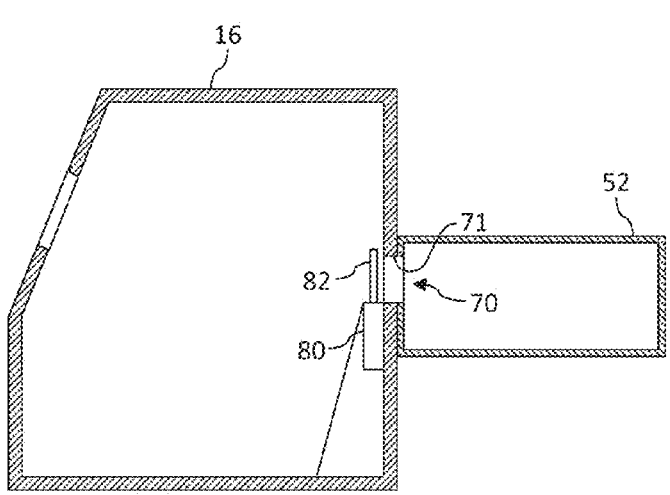

FIGS. 10A to 10C are cross-sectional views that illustrate schematic configurations of a vacuum processing chamber 16 and an intermediate conveyance chamber 52 according to modified examples. In the embodiment described above, the configuration has been illustrated in which the shielding plate 82 is disposed inside the intermediate conveyance chamber 52, and the opening/closing device 80 of the shielding plate 82 is arranged on the lower side of the intermediate conveyance chamber-vacuum processing chamber communication port 71. In the modified example, as illustrated in FIG. 10A, it may be configured such that the opening/closing device 80 of the shielding plate 82 is arranged on the upper side of the intermediate conveyance chamber-vacuum processing chamber communication port 71, the intermediate conveyance chamber-vacuum processing chamber communication port 71 is opened by moving the shielding plate 82 upward, and the intermediate conveyance chamber-vacuum processing chamber communication port 71 is shielded by moving the shielding plate 82 downward. In addition, as the modified examples illustrated in FIGS. 10B and 10C, the shielding plate 82 may be disposed inside the vacuum processing chamber 16. In such a case, as illustrated in FIG. 10B, the opening/closing device 80 may be arranged on the upper side of the intermediate conveyance chamber-vacuum processing chamber communication port 71, or, as illustrated in FIG. 10C, the opening/closing device 80 may be arranged on the lower side of the intermediate conveyance chamber-vacuum processing chamber communication port 71.

Figure 11A:
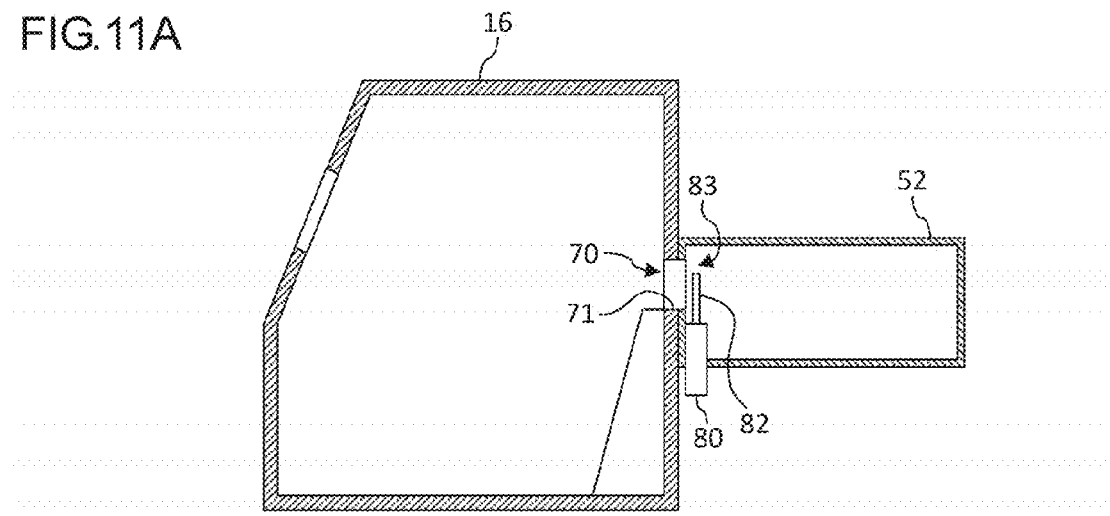
FIGS. 11A to 11C are cross-sectional views that illustrate schematic configurations of a vacuum processing chamber and an intermediate conveyance chamber according to modified examples.
Figure 11B:
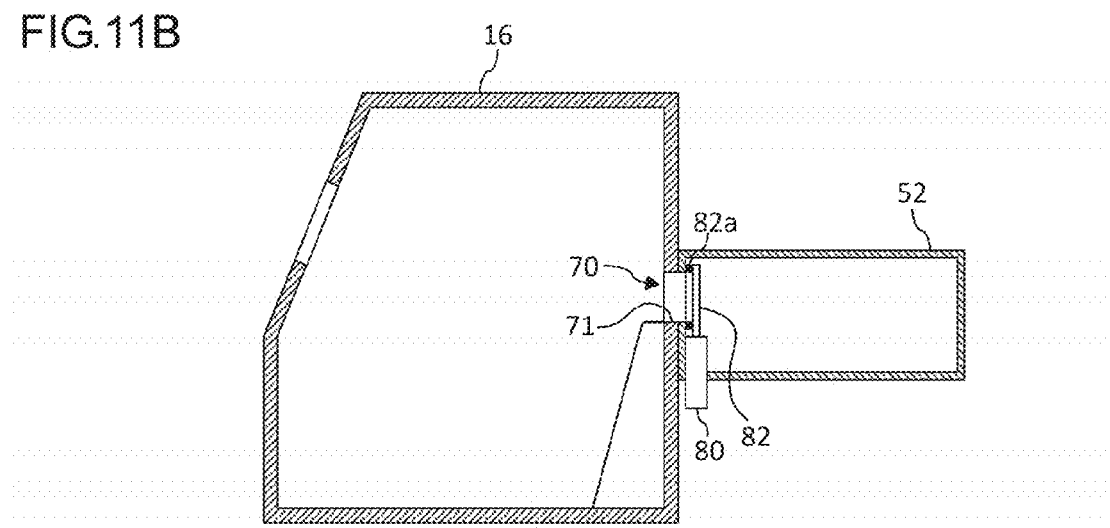
Figure 11C:
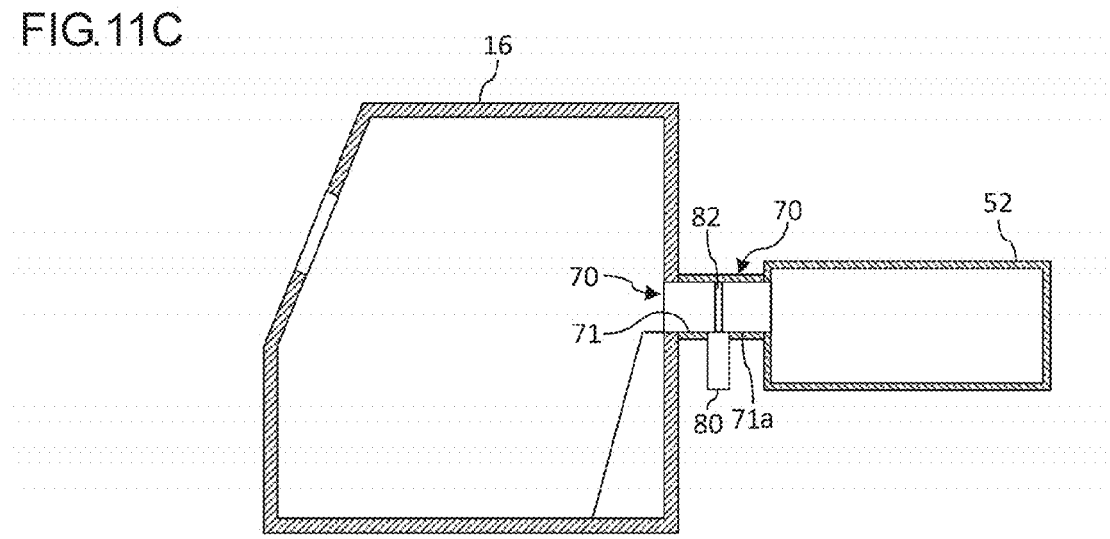

FIGS. 11A to 11C are cross-sectional views that illustrate schematic configurations of a vacuum processing chamber 16 and an intermediate conveyance chamber 52 according to modified examples. In the embodiment described above, the case has been described in which the shielding plate 82 located at the closed position blocks the entirety of the intermediate conveyance chamber-vacuum processing chamber communication port 71. In the modified example, as illustrated in FIG. 11A, the shielding plate 82 located at the closed position may close a part of the intermediate conveyance chamber-vacuum processing chamber communication port 71. In such a case, a gap 83 may be arranged between the inner wall of the intermediate conveyance chamber 52 and the shielding plate 82. In another modified example, as illustrated in FIG. 11B, the shielding plate 82 may be configured to include a sealing portion 82a so as to be able to seal the intermediate conveyance chamber-vacuum processing chamber communication port 71.

In addition, in the embodiment and the modified examples described above, while the case has been illustrated in which the shielding plate 82 is disposed in the vacuum processing chamber 16 or the intermediate conveyance chamber 52, in another modified example, as illustrated in FIG. 11C, the shielding plate 82 may be disposed in the middle of the intermediate conveyance chamber-vacuum processing chamber communication port 71. Furthermore, the intermediate conveyance chamber-vacuum processing chamber communication port 71 may be configured by the outer wall of the vacuum processing chamber 16 or the intermediate conveyance chamber 52 or, as illustrated in FIG. 11C, may be configured by a communication wall 71a that connects the vacuum processing chamber 16 and the intermediate conveyance chamber 52. In other words, the intermediate conveyance chamber-vacuum processing chamber communication port 71 may have a predetermined length in a direction in which the vacuum processing chamber 16 and the intermediate conveyance chamber 52 are aligned adjacently.

Figure 12A:
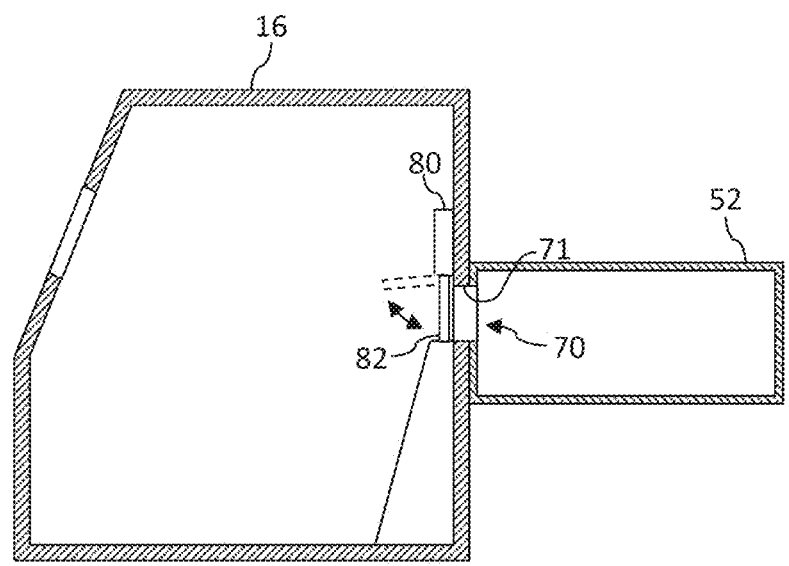
FIGS. 12A and 12B are cross-sectional views that illustrate schematic configurations of a vacuum processing chamber and an intermediate conveyance chamber according to modified examples.
Figure 12B:
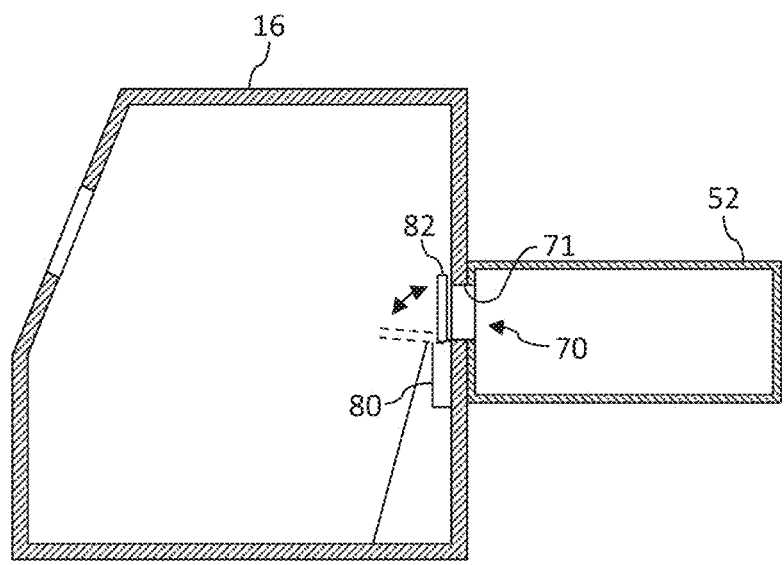

FIGS. 12A and 12B are cross-sectional views that illustrate schematic configurations of a vacuum processing chamber 16 and an intermediate conveyance chamber 52 according to modified examples. In the embodiment and the modified examples described above, the shielding plate 82 having the shutter structure has been illustrated in which the shielding plate 82 is opened/closed in the vertical direction perpendicular to the conveyance direction of the wafer in the intermediate conveyance chamber-vacuum processing chamber communication mechanism 70. In a further modified example, a flap structure may be employed in which one end of the shielding plate 82 is fixed to be rotatable, and the shielding plate 82 is opened/closed by moving the other end thereof in the conveyance direction of the wafer. As illustrated in FIG. 12A, the opening/closing device 80 may be arranged on the upper side of the intermediate conveyance chamber-vacuum processing chamber communication port 71. Alternatively, as illustrated in FIG. 12B, the opening/closing device 80 may be arranged on the lower side of the intermediate conveyance chamber-vacuum processing chamber communication port 71. In addition, the shielding plate 82 having the flap structure may be disposed inside the intermediate conveyance chamber 52.

It should be understood that the invention is not limited to the above-described embodiment, but may be modified into various forms on the basis of the spirit of the invention. Additionally, the modifications are included in the scope of the invention.

What is claimed is:

1. An ion implantation apparatus comprising:
    a vacuum processing chamber in which an ion implantation process for a wafer is performed by irradiating an ion beam on the wafer;
    one or more load lock chambers that are used for bringing the wafer into the vacuum processing chamber and taking out the wafer from the vacuum processing chamber;
    an intermediate conveyance chamber that is disposed to be adjacent to both the vacuum processing chamber and the load lock chamber;
    an intermediate conveyance mechanism that is disposed in the intermediate conveyance chamber and performs wafer conveyance between the load lock chamber and the intermediate conveyance chamber and wafer conveyance between the intermediate conveyance chamber and the vacuum processing chamber;
    a load lock chamber-intermediate conveyance chamber communication mechanism that includes a load lock chamber-intermediate conveyance chamber communication port for communication between the load lock chamber and the intermediate conveyance chamber and a gate valve capable of sealing the load lock chamber-intermediate conveyance chamber communication port;
    an intermediate conveyance chamber-vacuum processing chamber communication mechanism that includes an intermediate conveyance chamber-vacuum processing chamber communication port for communication between the intermediate conveyance chamber and the vacuum processing chamber and a movable shielding plate capable of shielding a part or the whole of the intermediate conveyance chamber-vacuum processing chamber communication port;
    a beam stopper disposed at a position in the vacuum processing chamber such that, in a case where the wafer is not present in a beam trajectory of the ion beam, the ion beam is incident onto the beam stopper;
    a first evacuation device connected to the vacuum processing chamber at a position different from the intermediate conveyance chamber-vacuum processing chamber communication port; and
    a beamline device that is disposed upstream of the vacuum processing chamber and that guides an ion beam irradiated on the wafer to the vacuum processing chamber,
    wherein the load chamber-intermediate conveyance chamber communication port and the intermediate conveyance chamber-vacuum processing chamber communication port are disposed for carrying the wafer through the communication ports,
    wherein the intermediate conveyance chamber is adjacent to the vacuum processing chamber in a direction in which the vacuum processing chamber and the beamline device are aligned, and
    wherein the intermediate conveyance chamber-vacuum processing chamber communication port is disposed on an upper side of the beam stopper so as to deviate from the beam trajectory.

2. The ion implantation apparatus according to claim 1, wherein the shielding plate is configured to be able to seal the intermediate conveyance chamber-vacuum processing chamber communication port.

3. The ion implantation apparatus according to claim 1, wherein the intermediate conveyance chamber is connected to a second evacuation device other than the first evacuation device.

4. The ion implantation apparatus according to claim 1, wherein the shielding plate is disposed in at least one of the intermediate conveyance chamber and the vacuum processing chamber.

5. The ion implantation apparatus according to claim 1, wherein the shielding plate is disposed in the middle of the intermediate conveyance chamber-vacuum processing chamber communication port.

6. The ion implantation apparatus according to claim 1, wherein the shielding plate is configured to be changeable between an open position at which the wafer conveyance between the intermediate conveyance chamber and the vacuum processing chamber is not blocked and a closed position at which a part or the whole of the intermediate conveyance chamber-vacuum processing chamber communication port is shielded.

7. The ion implantation apparatus according to claim 6, wherein the shielding plate is set to the open position when the wafer is conveyed between the intermediate conveyance chamber and the vacuum processing chamber and is set to the closed position when an ion implantation process is performed in the vacuum processing chamber.

8. The ion implantation apparatus according to claim 6, wherein the shielding plate is moved from the closed position to the open position before the wafer conveyance between the intermediate conveyance chamber and the vacuum processing chamber is started and is moved from the open position to the closed position after the wafer conveyance between the intermediate conveyance chamber and the vacuum processing chamber is completed.

9. The ion implantation apparatus according to claim 1, wherein the shielding plate has a shutter structure that is movable in a direction perpendicular to a conveyance direction of the wafer conveyed between the intermediate conveyance chamber and the vacuum processing chamber.

10. The ion implantation apparatus according to claim 9, wherein the shielding plate is configured by a gate valve capable of sealing the intermediate conveyance chamber-vacuum processing chamber communication port.

11. The ion implantation apparatus according to claim 1, wherein the shielding plate has a flap structure that is movable in a conveyance direction of the wafer conveyed between the intermediate conveyance chamber and the vacuum processing chamber.

12. The ion implantation apparatus according to claim 1, wherein the shielding plate interrupts entering of ions and/or particles sputtered by an ion beam from the vacuum processing chamber to the intermediate conveyance chamber by shielding a part or the whole of the intermediate conveyance chamber-vacuum processing chamber communication port.

13. The ion implantation apparatus according to claim 12, wherein a processed wafer, which is a target for a previous ion implantation process, and/or a unprocessed wafer, which is a target for a next ion implantation process, are brought into the intermediate conveyance chamber by the intermediate conveyance mechanism in the middle of the ion implantation process performed in the vacuum processing chamber, and wherein the shielding plate preserves the processed wafer and/or the unprocessed wafer brought into the intermediate conveyance chamber from being contaminated with the ions or the particles that are able to enter to the intermediate conveyance chamber.

14. The ion implantation apparatus according to claim 1, wherein the shielding plate reduces conductance of the intermediate conveyance chamber-vacuum processing chamber communication port by shielding a part or the whole of the intermediate conveyance chamber-vacuum processing chamber communication port and so as to suppress a pressure variation suffered by the vacuum processing chamber, and wherein the pressure variation is due to an increase in pressure of the intermediate conveyance chamber by causing the intermediate conveyance chamber and the load lock chamber to communicate with each other by opening the gate valve.

15. The ion implantation apparatus according to claim 1, wherein the intermediate conveyance chamber is adjacent to the vacuum processing chamber in a direction in which the beamline device extends.

16. The ion implantation apparatus according to claim 15, wherein the load lock chamber is adjacent to the intermediate conveyance chamber in a direction perpendicular to the direction in which the beamline device extends.

17. The ion implantation apparatus according to claim 16, comprising a first load lock chamber and a second load lock chamber that are disposed at positions facing each other with the intermediate conveyance chamber being interposed therebetween.

18. A control method for an ion implantation apparatus, the ion implantation apparatus comprising:

a vacuum processing chamber in which an ion implantation process for a wafer is performed by irradiating an ion beam on the wafer;

one or more load lock chambers that are used for bringing the wafer into the vacuum processing chamber and taking out the wafer from the vacuum processing chamber;

an intermediate conveyance chamber that is disposed to be adjacent to both the vacuum processing chamber and the load lock chamber;

an intermediate conveyance mechanism that is disposed in the intermediate conveyance chamber and performs wafer conveyance between the load lock chamber and the intermediate conveyance chamber and wafer conveyance between the intermediate conveyance chamber and the vacuum processing chamber;

a load lock chamber-intermediate conveyance chamber communication mechanism that includes a load lock chamber-intermediate conveyance chamber communication port for communication between the load lock chamber and the intermediate conveyance chamber and a gate valve capable of sealing the load lock chamber-intermediate conveyance chamber communication port;

an intermediate conveyance chamber-vacuum processing chamber communication mechanism that includes an intermediate conveyance chamber-vacuum processing chamber communication port for communication between the intermediate conveyance chamber and the vacuum processing chamber and a movable shielding plate capable of shielding a part or the whole of the intermediate conveyance chamber-vacuum processing chamber communication port;

a beam stopper disposed at a position in the vacuum processing chamber such that, in a case where the wafer is not present in a beam trajectory of the ion beam, the ion beam is incident onto the beam stopper;

a first evacuation device connected to the vacuum processing chamber at a position different from the intermediate conveyance chamber-vacuum processing chamber communication port; and a beamline device that is disposed upstream of the vacuum processing chamber and that guides an ion beam irradiated on the wafer to the vacuum processing chamber, wherein the load lock chamber-intermediate conveyance chamber communication port and the intermediate conveyance chamber-vacuum processing chamber communication port are disposed for carrying the wafer through the communication ports, wherein the intermediate conveyance chamber is adjacent to the vacuum processing chamber in a direction in which the vacuum processing chamber and the beamline device are aligned, and wherein the intermediate conveyance chamber-vacuum processing chamber communication port is disposed on an upper side of the beam stopper so as to deviate from the beam trajectory, the control method comprising:

setting the shielding plate to an open position not blocking wafer conveyance between the intermediate conveyance chamber and the vacuum processing chamber when the wafer is conveyed between the intermediate conveyance chamber and the vacuum processing chamber; and setting the shielding plate to a closed position shielding apart or the whole of the intermediate conveyance chamber-vacuum processing chamber communication port when an ion implantation process is performed in the vacuum processing chamber.

* * * * *